United States Patent [19]

Wojtowicz

[11] Patent Number: 4,975,669

[45] Date of Patent: Dec. 4, 1990

[54] MAGNETIC BOTTLE EMPLOYING MEISSNER EFFECT

[75] Inventor: Peter J. Wojtowicz, Mercer, N.J.

[73] Assignee: David Sarnoff Research Center, Inc., Princeton, N.J.

[21] Appl. No.: 315,753

[22] Filed: Feb. 27, 1989

[51] Int. Cl.$^5$ .............................................. H01F 7/22
[52] U.S. Cl. .................................... 335/216; 310/90.5
[58] Field of Search ............................ 174/15.4, 125.1; 335/216, 299; 505/1; 310/90.5

[56] References Cited

U.S. PATENT DOCUMENTS 4,797,386  1/1989  Gyorgy et al. ................ 335/216 X

OTHER PUBLICATIONS

"A Magnetic Storage Ring for Neutrons", Paul et al., Conference Paper, Fundamental Physics with Reactor Neutrons and Neutrinds, Oct. 10-11, 1977, Grenoble, France Published by Institute of Physics, London, England.

"Behavior of a Hollow Superconducting Cylinder in a Magnetic Field", Aruntanian et al., J. Low Temp. Phys. (U.S.A.) vol. 52, No. 5-6, Sep. 1983, pp. 409-431.

Primary Examiner—George Harris
Attorney, Agent, or Firm—W. J. Burke

[57] ABSTRACT

The Meissner effect is employed to generate a magnetic bottle in the interior region of a hollow superconductor, such as a hollow cylinder. One or both ends of the interior region of the hollow superconductor may be uncapped to permit coupling from the exterior to the interior of the superconductor.

16 Claims, 6 Drawing Sheets

ONE LOBE OF DIPOLE MAGNETIC FIELD IN
FIRST POSITION ON SUPERCONDUCTOR AXIS

HOLLOW-CYLINDER
SUPERCONDUCTOR 100

Fig. 1a

DIPOLE
MAGNET
104

Fig. 1b

ONE LOBE OF DIPOLE MAGNETIC FIELD
IN ABSENCE OF SUPERCONDUCTOR 100

Fig. 1c

ONE LOBE OF DIPOLE MAGNETIC FIELD IN
FIRST POSITION ON SUPERCONDUCTOR AXIS

Fig. 2a

ONE LOBE OF DIPOLE MAGNETIC FIELD IN
SECOND POSITION ON SUPERCONDUCTOR AXIS

Fig. 2b

ONE LOBE OF DIPOLE MAGNETIC FIELD IN
THIRD POSITION ON SUPERCONDUCTOR AXIS

MAGNETIC BOTTLE EMPLOYING MEISSNER EFFECT

BACKGROUND OF THE INVENTION

1. Field of the Invention:

This invention relates to superconductors that repel an element possessing a magnetic moment in accordance with the so-called Meissner effect and, more particularly, to such a superconductor that is so shaped and configured as to operate as a magnetic bottle.

2. Description of the Prior Art:

As is known in the art, a magnetic bottle employs a magnetic field that occupies a given volume of space, which magnetic field tends to prevent an element possessing a magnetic moment situated within this volume of space from escaping from this volume of space. More specifically, the field strength of a magnetic field within this volume of space is so configured that it applies a restoring force to the element in response to the element tending to move out of the given volume of space, regardless as to the direction of movement of the element. Put another way, a potential well exists within the given volume of space surrounded by a potential barrier at the boundry of the given volume of space with the exterior.

In the past, external magnets of complex design have been required to generate a magnetic field intensity spatial distribution that constitutes a magnetic bottle. Often, to provide a magnetic field exhibiting a sufficiently large potential gradient, the external magnets were comprised of superconducting electro-magnets. In this case, the Meissner effect was not employed in the operation of such superconducting electro-magnets for the purpose of deriving a magnetic bottle.

The Meissner effect, as known in the art, is the ability of a material in a superconducting state to expel all magnetic fields therefrom (i.e., such a superconductor is perfectly diamagnetic and exhibits a permeability of zero). More specifically, as known in the art, an external magnetic field, in interacting with a superconductor, is capable of penetrating the surface of the superconductor only to a so-called penetration depth of a few micrometers, at most. The result is that the magnetic-field spatial distribution is distorted by the presence of a superconductor with which it interacts. Such a distorted magnetic field contains more potential energy than it otherwise would in the absence of the superconductor.

In the past, the Meissner effect has been used to levitate a dipole magnet placed on the surface of a superconductor. The levitation force, which is directed opposite to gravity, arises from the potential gradient of the distorted (i.e., compressed) magnetic field of the dipole magnet that exists between the bottom of the levitated magnet and the surface of the superconductor with which it is interacting. Often, such levitation is used to indicate that the material underlying the dipole magnet is, in fact, operating as a superconductor.

SUMMARY OF THE INVENTION

The present invention makes use of the Meissner effect, rather than externally generated magnetic fields, to create a magnetic bottle. More specifically, the present invention is directed to a magnetic bottle comprised of the interior region of a hollow superconductor. The interior region is characterized by having a first given shape and a first given size defined by the shape and size of the interior surface of the hollow superconductor. The first given shape is such that an element possessing a magnetic moment and having a second given shape and a second given size that is smaller than the first given size, which element has been initially placed within the interior region, is maintained within the interior region without physical support in spaced relationship with respect to the entire interior surface of the superconductor by a magnetic field potential energy well resulting from the Meissner effect that is located within the interior region.

BRIEF DESCRIPTION OF THE DRAWING

FIG. 1b illustrates a dipole magnet, which constitutes a preferred embodiment of an element possessing a magnetic moment, which is initially placed within the interior region of the hollow-superconductor shown in FIG. 1a;

FIGS. 2a, 2b and 2c, respectively are one of two lobes of planar projections of the magnetic field of the dipole magnet of FIG. 1b when it is situated, respectively, at each of first, second and third different given positions on the axis of the hollow-cylinder superconductor shown in FIG. 1a; and FIG. 3 is a plot of the relative potential energy contained in the magnetic field of the dipole magnet of FIG. 1b when it is located at different points along the longitudinal axis of the hollow-cylinder superconductor shown in FIG. 1a.

DESCRIPTION OF THE PREFERRED EMBODIMENTS

Figure 1A:
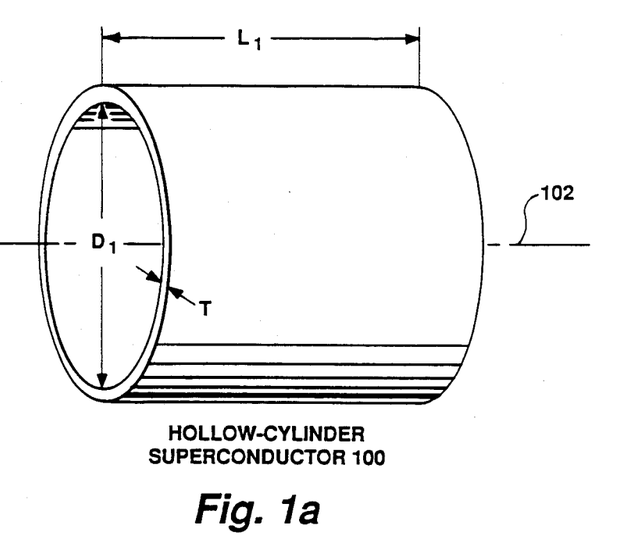
FIG. 1a illustrates a hollow-cylinder superconductor that constitutes a preferred embodiment of the given shape of the superconductor of the present invention.

Referring to FIG. 1a, there is shown hollow-cylinder superconductor 100 (i.e., a hollow-cylinder comprised of a material that exhibits superconductivity when cooled below the superconducting crirtical temperature). As indicated, hollow-cylinder 100 is a circular cylinder having a given wall thichness T, a given internal diameter $D_1$ and a given length $L_1$. Thus, the interior surface of superconductor 100 defines an open-ended, hollow interior region having a circularly cylindrical shape that is oriented symmetrically about longitudinal axis 102. The minimum value of the wall thickness T must be greater than a few micrometers, the maximum penetrating distance of a magnetic field into a superconductor. However, for practical reasons discussed below, the maximum value of the wall thickness T should be no greater than one-quarter that of the internal diameter $D_1$. Preferably hollow-cylinder superconductor 100 should be comprised of a thin-wall cylinder in which the value of the wall thickness T is much smaller than its practical maximum value of one-quarter of the internal diameter $D_1$. Further, for reasons to be discussed below, it is preferable that the respective values of the internal diameter $D_1$ dimension and the length $L_1$ of hollow-cylinder superconductor 100 be relatively close to one another, although this is not essential.

Figure 1B:
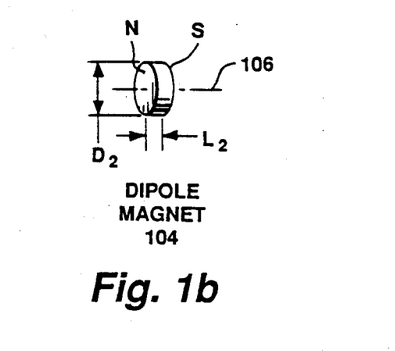

Referring now to FIG. 1b, there is shown dipole magnet 104 disposed about its dipole axis 106 that extends between its north (N) and south (S) magnetic poles. As indicated in FIG. 1b, dipole magnet 104 has a circular cross section diameter $D_2$ and has a given length $L_2$ parallel to its dipole axis 106. The respective values of $D_2$ and $L_2$ of dipole magnet 104 must be smaller than the respective values of $D_1$ and $L_1$ of superconductor 100, so that dipole magnet 104 can be situated within the hollow interior region of superconductor 100 without physically touching any of the interior surfaces of the superconductor. For reasons to be discussed below, the respective values of $D_2$ and $L_2$ should be no greater than one-quarter of the respective values of respective values of $D_1$ and $L_1$ in a practical implementation of the invention, but preferably the respective values of $D_2$ and $L_2$ should be significantly smaller than one-quarter of the respective values of $D_1$ and $L_1$.

As is known in the art, the projection of the unconstrained magnetic field of a dipole comprises two lobes pointing in opposite directions perpendicular to the dipole axis, thereby forming a "figure-eight" pattern. A magnetic field extends in space toward infinity, at which distance the scalar potential $\phi$ of the magnetic field has a value of zero. The relative value of the scalar potential $\phi$ of the magnetic field at any spatial point increases as the distance between the dipole magnet and that spatial point decreases.

From a more quantitative point of view, with specified initial conditions (which include the relative level and spatial direction of the magnetic moment of the dipole magnet and any magnetic constraints that may be present in the space surrounding the dipole magnet), it is known that the Laplace equation can be used to compute the respective values of the scalar potential $\phi$ at each point of space surrounding the dipole. More specifically, in accordance with the Laplace equation, the value of the scalar potential $\phi$ at each point is such that the sum of the three second-order derivitives of the scalar potential $\phi$ at that point with respect to each of the three spatial dimensions is zero. Given the specified initial conditions, a computer can be programmed to make this computation (i.e., solve the Laplace equation) for as many spatial points as desired.

It is also known that the intensity of a magnetic field at any point is a magnetic force vector having a magnitude equal to the gradient of the scalar potential at that point and a direction which is opposite to the direction of that potential gradient at that point.

Figure 1C:
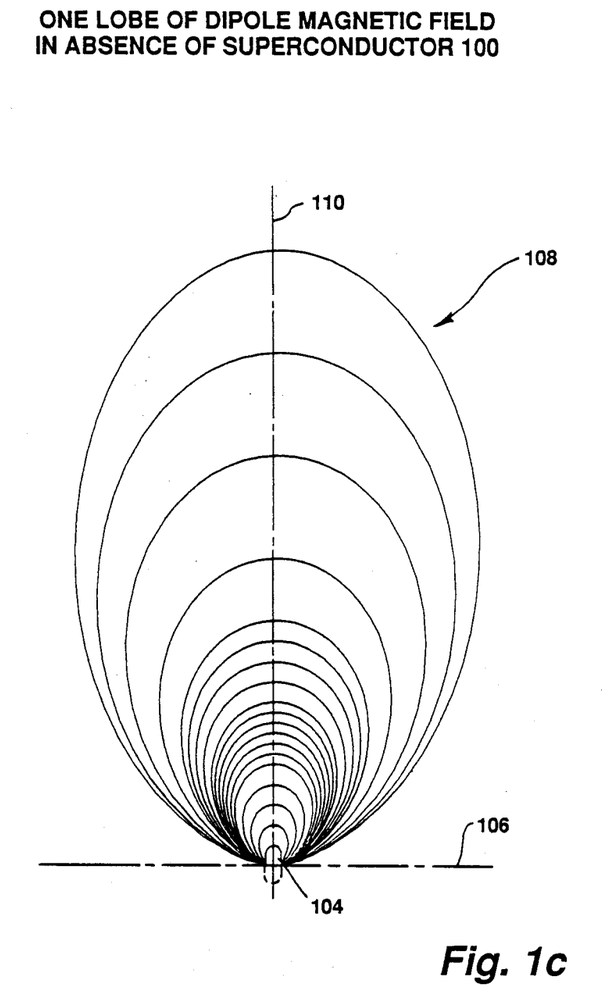
FIG. 1c is one lobe of a planar projection of the dipole magnet shown in FIG. 1b in the absence of any superconductor.

Reference is made to FIG. 1c, which shows plot 108 of the relative intensity of one of the two symmetric lobes (i.e., projections) of a dipole magnetic field in the absence of superconductor 100 (i.e., an unconstrained dipole magnet in free space). More accurately, since each dipole magnetic field lobe is three-dimensional and extends to infinity, and is cylindrically symmetrical about a lobe axis perpendicular to the dipole axis, plot 108, shown in FIG. 1c, actually shows a portion of a planar central slice of one lobe of the dipole magnetic field through lobe axis 110 in the vicinity of dipole magnet 104, wherein dipole magnet 104 is situated in free space. As indicated FIG. 1c, lobe axis 110 is perpendicular to dipole axis 106. It is apparent that since the three dimensional lobe is cylindrically symmetrical about axis 110, different planar central slices through lobe axis 110 will exhibit the same magnetic field pattern as that shown by plot 108 in FIG. 1c. It is also apparent that the other lobe (not shown) of the dipole magnetic field in the absence of superconductor 100 will exhibit a field pattern that is the mirror image of that shown in plot 108.

It is known that a magnetic field possesses magnetic potential energy. It is further known that a dipole magnet in free space possesses relatively the minimum amount of potential energy in its magnetic field. Put another way, any distortion in the position of any of the respective field lines shown in plot 108 (such as by stretching, compression, etc.) would result in the potential energy possessed by such distorted magnetic field being greater than that possessed by the undistorted magnetic field shown in plot 108. Such distortion is analogous to stretching or compressing a spring in order to store energy in the spring.

For illustrative purposes in describing the present invention, the following assumptions will be made. First, it will be assumed that the second given length $L_2$ of dipole magnet 104 is 1/11th the first given length $L_1$ of superconductor 100. Second, it will be assumed that dipole magnet 104 is situated with its dipole axis 106 in alignment with longitudinal axis 102 of superconductor 100 and that dipole magnet 104 is moved to various positions along longitudinal axis 102 (some of which positions are located within the hollow interior region of the cylindrical superconductor 100 and some of which positions are located beyond the ends of such hollow interior region but still in the vicinity of superconductor 100).

Figure 2A:
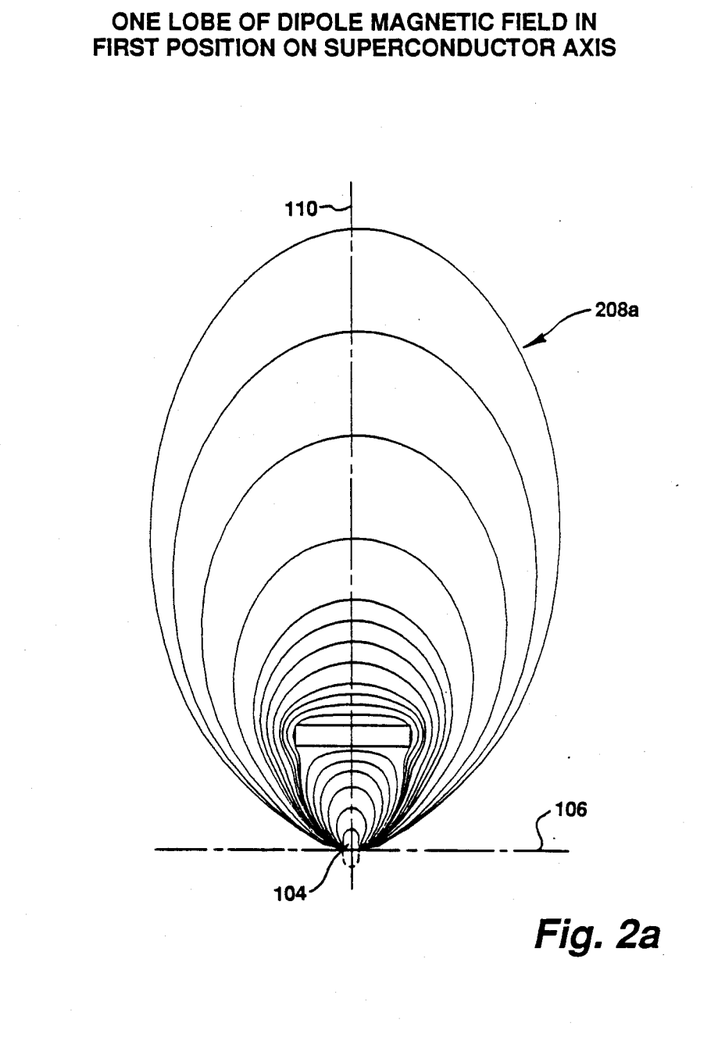
Figure 2B:
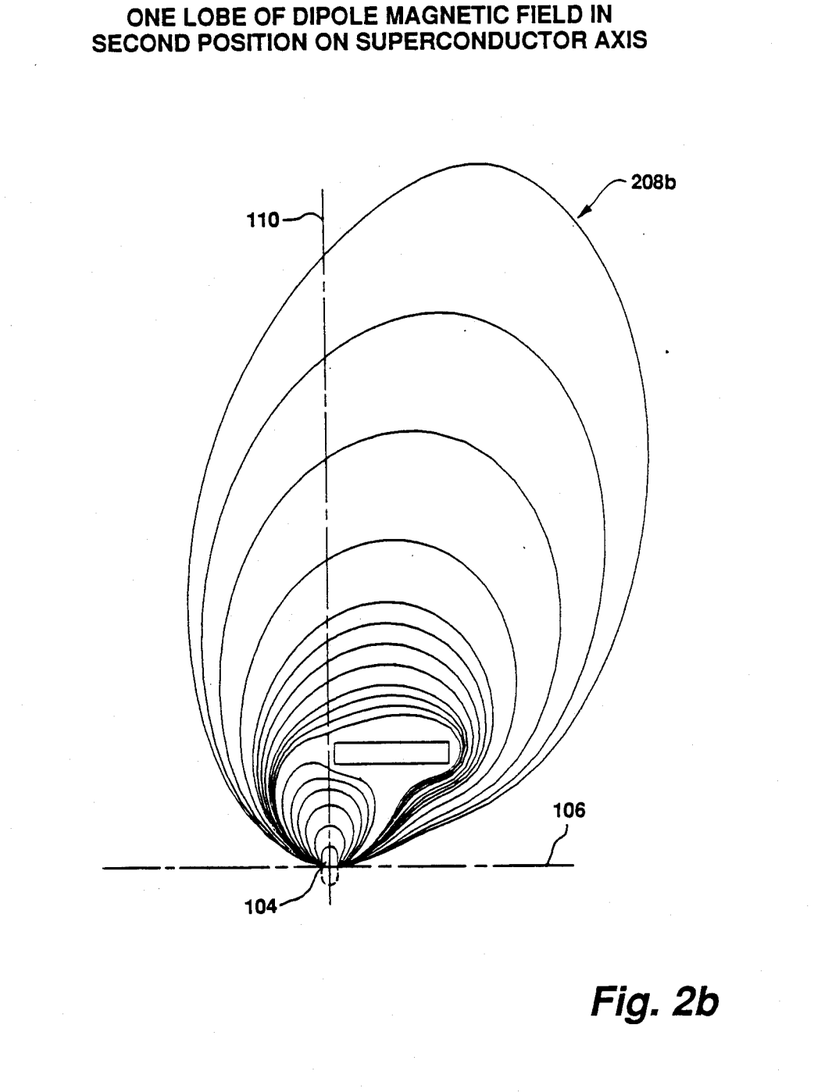
Figure 2C:
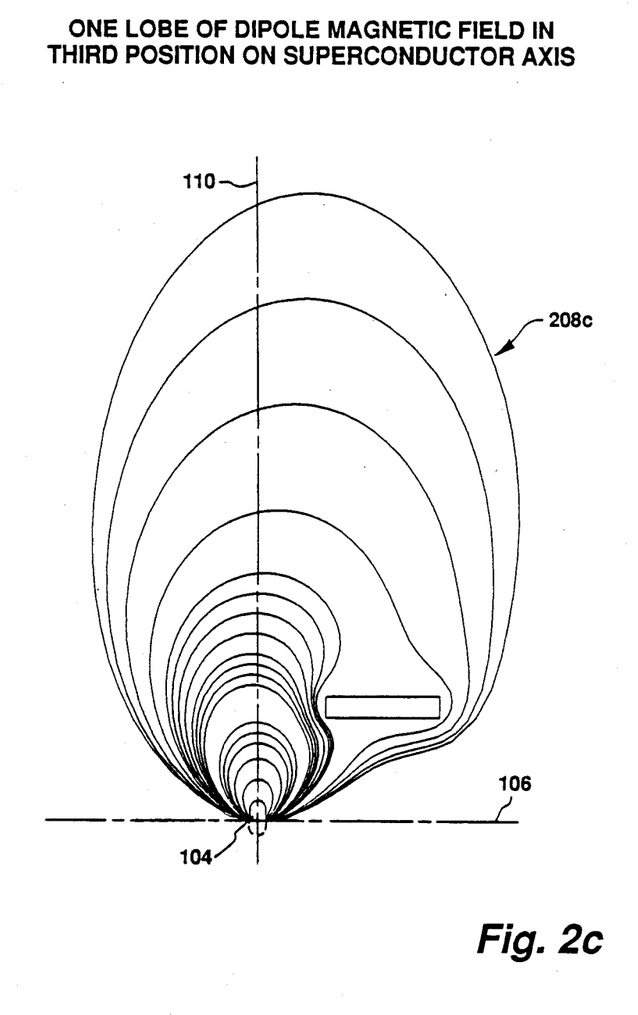

Reference is now made to FIGS. 2a, 2b, and 2c, which, respectively, show the computed spatial distribution of the intensity of the magnetic field at each of three different particular positions of dipole magnet 104 along the longitudinal axis 102 of superconductor cylinder 100. Specifically, FIG. 2a shows a plot 208a of the dipole magnetic field of dipole magnet 104 located at a first position of superconductor axis 102. At the first position the midpoint of the length $L_2$ of dipole magnet 104 (shown in FIG. 1b) is situated within the interior region of cylinder 100 at the midpoint of the length $L_1$ (shown in FIG. 1a).

In accordance with the Meissner effect, the presence of the superconductor 100 modifies the initial magnetic conditions in a manner that results in a constraining effect on the magnetic field shown by plot 208a. Specifically, due to the Meissner effect, magnetic field 208a cannot enter the space occupied by superconductor 100, so that a contraining initial condition is that the magnetic potential within the space occupied by cylinder 100 is zero. As indicated in FIG. 2a, in order to accomodate this constraint, the magnetic field of dipole magnet 104 is distorted in the manner shown in plot 208a with respect to the magnetic field of plot 108 (shown in FIG. 1c) which would exist in the absence of superconductor 100. Due to this distortion, the magnetic field shown in plot 108a possesses more potential energy than the undistorted magnetic field shown in plot 108 of FIG. 1c.

In FIG. 2b, the midpoint of dipole magnet 104 has been moved to a second position along longitudinal axis 106, which second position is situated a distance of 0.6 of the first given length $L_1$ of cylinder 100 (shown in FIG. 1a) from the first position thereof (situated at the midpoint of first given length $L_1$). Thus, in FIG. 2b, dipole magnet 104 is situated just beyond the end of cylinder 100. Plot 208b shows the computed distortions in magnetic field due to the presence of superconductor cylinder 100, in accordance with the Meissner effect. For the same reasons discussed above in connection with FIG. 2a, the distorted magnetic field shown in plot 208b possesses more potential energy than the undistorted magnetic field shown in plot 108 of FIG. 1c.

FIG. 2c shows the case in which the midpoint of dipole magnet 104 has been moved to a third position along longitudinal axis 106 which is located at a distance of 1.2 of the first given length $L_1$ of cylinder 100 from the midpoint of the first given length $L_1$ of cylinder 100. Again, as shown by plot 208c, the computed magnetic field is distorted by the presence of cylinder 100 and, therefore, the magnetic field of plot 208c also possesses more potential energy than the undistorted magnetic field shown in plot 108 of FIG. 1c.

Comparison of plots 208a, 208b and 208c shows that the type and amount of distortion of the respective plotted magnetic fields are different from one another. The respective values of the magnetic potential energy difference between each individual one of the three respective plotted distorted magnetic fields 208a, 208b and 208c, and the plotted undistorted magnetic field 108 can be computed.

Figure 3:
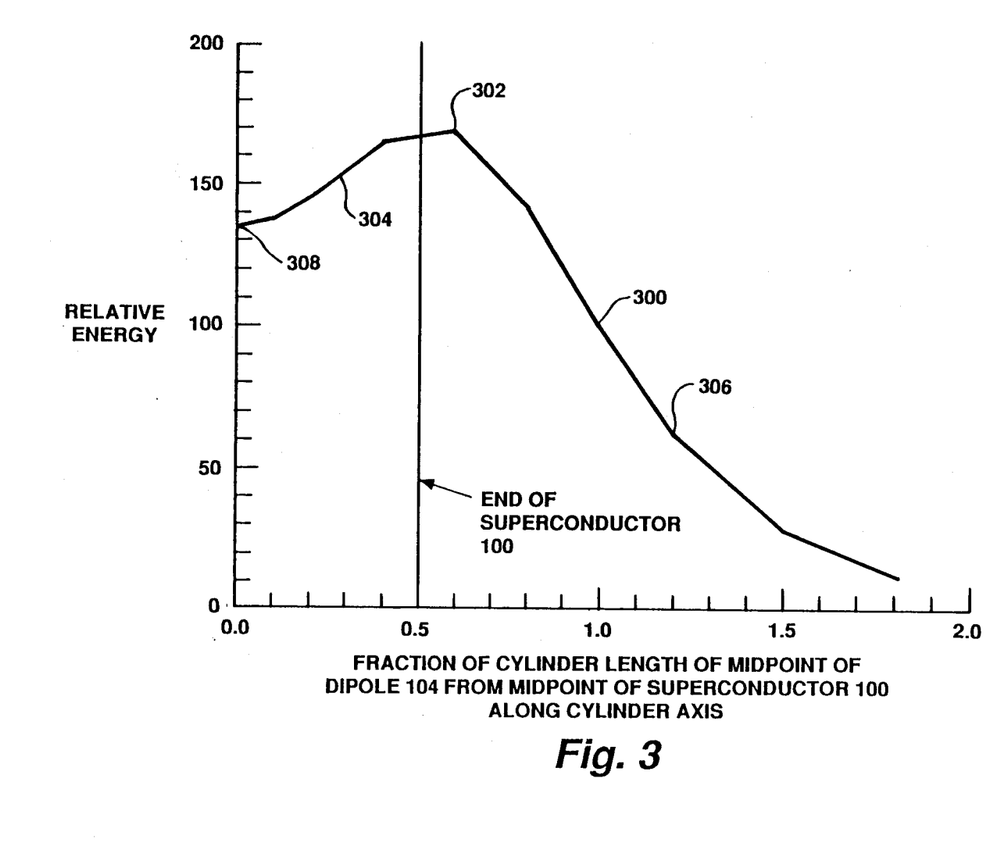

FIG. 3 is a graph showing the computed values of the relative potential energy of the distorted magnetic fields at each of the first, second and third axial positions shown in FIG. 2a, 2b and 2c (as well as at additional axial positions that have not been specifically disclosed herein), with respect to a ground potential energy possessed by an undistorted magnetic field of dipole magnet 104 in free space (shown in FIG. 1c). In FIG. 3, the abscissa represents the fraction of cylinder length $L_1$ of the midpoint of dipole magnet 104 along longitudinal axis 106 from the midpoint of the cylinder length $L_1$ of superconductor 100. Thus, the first position, shown in FIG. 2a, corresponds to the origin of the graph shown in FIG. 3. The ordinate in FIG. 3 represents the relative potential energy difference (with respect to a ground level of potential energy possessed by the undistorted magnetic field of plot 108 being considered zero, with the units of relative energy shown in FIG. 3 being arbitrary).

As indicated in FIG. 3, an end of superconductor 100 corresponds to an abscissa value of 0.5. Plot 300 shows (1) a potential barrier having its peak 302 at the second position shown in FIG. 2b (an abscissa value of 0.6 in FIG. 3); (2) a potential well 304 that extends 1.2 length units to the left of peak 302 (i.e., the potential well is comprised of all abscissa values between ±0.6, thereby including the entire first given length $L_1$ of the interior region within superconductor 100—an interval of one whole length unit to the left of the abscissa value 0.5 in FIG. 3), and (3) a potential engergy descent from the peak 302 of the potential barrier toward the ground potential level of zero for all abscissa values greater than 0.6 (such as the abscissa value of 1.2 of the third position of FIG. 2c).

As indicated by plot 300 of FIG. 3, the bottom 308 of potential well 304 (which occurs at the origin of plot 300 and corresponds to the first position of FIG. 2a) still possesses a relative potential energy which is much higher than the ground level, but which is significantly lower than peak 302 of the potential barrier.

So long as dipole magnet 104 is actually disposed within the hollow interior region of superconductor cylinder 100, it will be located within potential well 304. Therefore, any longitudinal displacement of dipole magnet 104 from the midpoint of the first given length $L_1$ of superconductor 100 results in a restoring force which tends to move dipole magnet 104 back to the bottom 308 of potential well 304.

So long as dipole magnet 104 is within the hollow interior region of superconductor 100, it is surrounded by the interior surface of the superconductor cylindrical surface. Due to the Meissner effect, any tendency of dipole magnet 104 to move away from the longitudinal axis of superconductor 100 and closer to the wall thereof will result in its magnetic field being distorted in such a manner as to produce a potential gradient restoring force urging dipole magnet 104 back to the longitudinal axis (for all the reasons discussed above). Thus, although the ends of superconductor cylinder 100 are uncapped, a magnetic bottle is generated within the hollow interior region of superconductor 100 which prevents dipole magnet 104, once placed in the magnetic bottle, from escaping from the magnetic bottle (unless, of course, somehow dipole magnet 104 acquires excessive kinetic energy sufficient to overcome potential barrier 302).

The present invention is not limited to hollow superconductors configured as circular cylinders, such as shown in FIG. 1a for illustrative purposes. The interior region of the hollow superconductor may have a different shape from that of a circular cylinder, so long as an element possessing a magnet moment, such as dipole magnet 104, after being initially placed within the interior region, is maintained within the interior region without physical support in spaced relationship with respect to the entire interior surface of the hollow superconductor by a magnetic field potential energy well resulting from the Meissner effect. For instance, the interior surface of the hollow superconductor may define a non-circular given cylindrical shape that is symmetric about the longitudinal axis of the superconductor non-circular cylinder. Furthermore, one or both of the ends of a superconductor cylinder (whether circular or not) may be capped, since the existence of a potential well within the interior region of the cylinder resulting from the Meissner effect is independent of such capping. If both ends of a cylinder are capped, the bottom of the potential well will still occur at the midpoint of the given length of the cylinder. However, if only one of the two ends of the cylinder is capped, the bottom of the potential well will be moved from the midpoint to a point closer to the uncapped end of the cylinder. Nevertheless, a magnetic bottle still exists within the hollow interior region of the cylinder.

The given shape of the hollow interior region of the superconductor is not limited to that of a cylinder either. Other shapes, such as a hollow cone shape having one open end, may be employed to provide a potential well within its hollow interior region, with the bottom of the potential well being situated closer to its open end than to its closed (i.e., apex) end.

In the embodiment of superconductor 100 shown in FIG. 1a, both the interior and exterior surfaces of the superconductor are circularly cylindrical, so that the value of the wall thickness T is constant. This need not be the case. The outer surface of superconductor 100 may have a different shape from the inner surface thereof, so that the value of the wall thickness T may vary from a minimum value to a maximum value. However, from a practical point of view, the maximum value of wall thickness T should be no more than one-quarter of the value of the superconductor internal diameter $D_1$ (or if the internal surface of the superconductor is not circular, one-quarter of the maximum cross sectional dimension thereof) in order to insure that a magnetic potential well having at least a minimum significant gradient is established in the hollow interior region of the superconductor. More specifically, if the thickness of superconductor 100 in FIG. 2a were to become much larger than the aforesaid one-quarter value, those lines of force of the magnetic field of dipole magnet 104 which leave the superconductor through the ends thereof and surround superconductor 100 in relatively close proximity thereto, which are the most distorted lines of force, consequently traverse a much longer path around superconductor 100 and, therefore, become much weaker (separated from each other by a greater distance). While increasing the value of the wall thickness T the superconductor 100 affects the lines of force of the magnetic field of FIGS. 2b and 2c in a similar manner, it does so to a lesser extent because the path lengths of the relatively close lines of force corresponding to lines of force in FIG. 2a that surround the superconductor, are already relatively long in FIGS. 2b and 2c compared to the path lengths of these lines of force in FIG. 2a.

For the reasons set forth above, it is apparent that the difference in potential energy between the potential barrier 302 and the bottom 308 of the potential well 304 becomes smaller as the value of the wall thickness T becomes larger. It is for this reason that it is desireable that superconductor cylinder 100 be a thin-walled cylinder, or, at most, that the maximum value of the wall thickness T be limited to a value no greater than one-quarter of the maximum cross section of the interior surface of superconductor 100.

For similar reasons of practicality to those described above in connection with wall thickness, the ratio of the respective values of the length of dipole 104 to the length of superconductor 100 should be no greater than one-quarter and the ratio of the respective values of the maximum cross sectional dimension of magnet 104 to the minimum cross sectional dimension of superconductor 100 should be no greater than one-quarter.

The magnetic bottle of the present invention is useful in research as a container for one or more particles of anti-matter that exhibit a magnetic moment, since anti-matter is annihalated upon physical contact with ordinary matter. Further, the fact that the magnetic bottle of the present invention may be open ended makes it possible to employ the magnetic bottle of the present invention as a frictionless magnetic bearing situated within the hollow interior region of the superconductor for a rotating shaft that extends through the superconductor to utilization means situated outside the hollow interior region of the superconductor.

A superconductor usually needs to be cooled by a suitable coolant. By pumping this coolant through channels within the superconductor wall in a manner similar to the arrangement used to water-cool an automobile engine, no coolant would be present within the hollow interior region of the superconductor, which is desireable.

What is claimed is:

1. A magnetic bottle comprised of the interior region of a hollow superconductor, said superconductor being comprised of material which in its operative superconducting state substantially expels all magnetic fields therefrom, whereby said superconductor in its operative superconducting state is substantially perfectly diamagnetic and exhibits a permeability of substantially zero, said interior region being characterized by having a first-given shape and a first-given size defined by the shape and size of the interior surface of said hollow superconductor, said first-given shape being such that an element possessing a magnetic moment and having a second-given shape and second-given size that is smaller than said first-given size, which element has been initially placed within said interior region, is maintained within said interior region without physical support in spaced relationship with respect to said entire interior surface by a magnetic field potential energy well resulting from the Meissner effect that is located within said interior region.

2. The magnetic bottle defined in claim 1, wherein:
said hollow superconductor comprises a cylinder having a relatively large first-given length and a relatively large first-given internal cross-sectional dimensions that define said interior region as having a first-given cylindrical shape that is symmetrical about the longitudinal axis of said superconductor cylinder, said interior region having a relatively large first-given size defined by said first-given length and said first-given internal cross-sectional dimensions, and said cylinder having a given maximum wall thickness;
said element comprises a dipole magnet having a second-given shape that is disposed about its dipole axis, said magnet having a relatively small second-given size defined by a relatively small second-given length parallel to said dipole axis and relatively small second-given cross-sectional dimensions perpendicular to said dipole axis; and the respective values of said given maximum wall thickness, the ratio of said relatively small second-given length to said relatively large first-given length, and the ratio of said relatively small second cross-sectional dimensions to said relatively large first-given internal cross-sectional dimensions are all such that magnetic forces within said interior region always tend to move said dipole magnet toward an equilibrium position at the bottom of said magnetic field potential energy well, and said equilibrium position is located substantially on the longitudinal axis of said interior region of said superconductor cylinder.

3. The magnetic bottle defined in claim 2, wherein:
said given maximum wall thickness has a value that is no greater than one-quarter of the value of the maximum of said first-given internal cross-sectional dimension.

4. The magnetic bottle defined in claim 2, wherein:
the value of said second-given length is no greater than one-quarter the value of said first-given length.

5. The magnetic bottle defined in claim 4, wherein:
the value of the maximum second-given cross-sectional dimension is no greater than one-quarter of the value of the minimum first-given internal cross-sectional dimension.

6. The magnetic bottle defined in claim 2, wherein:
said superconductor cylinder is a circular cylinder having a given internal diameter and a given constant wall thickness.

7. The magnetic bottle defined in claim 2, wherein:
said given constant wall thickness has a value that is no greater than one-quarter of the value of the maximum of said first-given internal cross-sectional dimension.

8. The magnetic bottle defined in claim 2, wherein:

the value of said second-given length is no greater than one-quarter the value of said first-given length.

9. The magnetic bottle defined in claim 4, wherein: the value of the maximum second-given cross-sectional dimension is no greater than one-quarter of the value of the minimum first-given internal cross-sectional dimension.

10. The magnetic bottle defined in claim 6, wherein: the respective values of said first-given length and said given internal diameter are substantially equal to one another.

11. The magnetic bottle defined in claim 6, wherein: at least one end of said hollow interior region is uncapped.

12. The magnetic bottle defined in claim 11, wherein: both ends of said hollow interior region are uncapped.

13. The magnetic bottle defined in claim 2, wherein: at least one end of said hollow interior region is uncapped.

14. The magnetic bottle defined in claim 13, wherein: both ends of said hollow interior region are uncapped.

15. The magnetic bottle defined in claim 1, wherein: at least one end of said hollow interior region is uncapped.

16. The magnetic bottle defined in claim 15, wherein: both ends of said hollow interior region are uncapped.

* * * * *